(12) United States Patent
Lin et al.

(10) Patent No.: US 7,575,948 B1
(45) Date of Patent: Aug. 18, 2009

(54) METHOD FOR OPERATING PHOTOSENSITIVE DEVICE

(75) Inventors: Chrong-Jung Lin, Hsinchu (TW); Ya-Chin King, Taipei (TW)

(73) Assignee: Art Talent Industrial Limited, Belize (BZ)

( * ) Notice: Subject to any disclaimer, the term of this patent is extended or adjusted under 35 U.S.C. 154(b) by 0 days.

(21) Appl. No.: 12/122,132

(22) Filed: May 16, 2008

(51) Int. Cl.
*H01L 21/00* (2006.01)
*H01L 29/788* (2006.01)

(52) U.S. Cl. .......................... 438/58; 438/29; 438/48; 438/60; 438/63; 438/65; 257/E21.27; 257/E21.645; 257/E21.705

(58) Field of Classification Search ............ 257/E21.27, 257/E21.645, E21.705
See application file for complete search history.

(56) References Cited

U.S. PATENT DOCUMENTS

| | | | |
|---|---|---|---|
| 7,071,019 B2 * | 7/2006 | Zhang et al. ................. | 438/59 |
| 7,402,897 B2 * | 7/2008 | Leedy ......................... | 257/678 |
| 2007/0052004 A1 * | 3/2007 | Chao et al. ................... | 257/315 |
| 2007/0272995 A1 * | 11/2007 | King et al. ................... | 257/440 |

* cited by examiner

*Primary Examiner*—Charles D. Garber
*Assistant Examiner*—Mohsen Ahmadi
(74) *Attorney, Agent, or Firm*—Thomas, Kayden, Horstemeyer & Risley

(57) ABSTRACT

A method for operating a photosensitive device is provided. At first, the photosensitive device is provided, which comprising a photo sensor circuit and a photo sensor, where the photo sensor is located above and electrically coupled with the photo sensor circuit, and where the photo sensor comprises a bottom electrode; a photosensitive layer located on the bottom electrode; and a transparent electrode located on the photosensitive layer. Then, a first electrical potential is supplied to the transparent electrode, and a second electrical potential is supplied to the bottom electrode, where the first electrical potential is greater than the second electrical potential.

6 Claims, 3 Drawing Sheets

METHOD FOR OPERATING PHOTOSENSITIVE DEVICE

BACKGROUND

1. Field of Invention

The present invention relates to a method for operating a semiconductor device. More particularly, the present invention relates to a method for operating a photosensitive device.

2. Description of Related Art

Nowadays, an image sensor is a device that converts an optical image to an electrical signal. It is a set of charge-coupled devices (CCD) or CMOS sensors such as active-pixel sensors.

In particular, CMOS image sensor (CIS) device is featured by lower operating voltage, lower power consumption and higher operating efficiency than that of CCD. Besides, CIS device can be produced in CMOS manufacturing process, so CIS device is widely applied in videophone, digital camera, mobile phone and aerospace industry.

Recently, as energy saving and environmental protection are becoming increasingly pressing issues, the countries and electronic society have launched a wide series of policies and set a lot of industry standard for power saving. Many companies are trying novel and effective approaches to meet this for power reduction. One of examples is to use the image sensor. Photo sensor (or photo detection device) is a quite critical embedded element for power-saving. For example, when the ambient light is bright, an integrated system (like a outdoor lighting system) can automatically cut down the power output to certain level by the assistance of the image sensor through detecting the incident lights.

SUMMARY

It is therefore an objective of the present invention to provide a method for operating the photosensitive device to achieve optimum photo conversion performance.

In accordance with an embodiment of the present invention, the method for operating a photosensitive device comprises the following steps. At first, the photosensitive device is provided, which comprising a photo sensor circuit and a photo sensor, where the photo sensor is located above and electrically coupled with the photo sensor circuit, and where the photo sensor comprises a bottom electrode; a photosensitive layer located on the bottom electrode; and a transparent electrode located on the photosensitive layer. Then, a first electrical potential is supplied to the transparent electrode, and a second electrical potential is supplied to the bottom electrode, where the first electrical potential is less than the second electrical potential.

It is another objective of the present invention to provide another method for operating the photosensitive device to achieve optimum performance.

In accordance with another embodiment of the method for operating a photosensitive device comprises the following steps. At first, the photosensitive device is provided, which comprising a substrate, a read-out transistor located on the substrate and a photo sensor located above the read-out transistor. The read-out transistor comprises a gate and a drain/source pair. The photo sensor comprises a bottom electrode electrically coupled with one of the drain/source pair, a photosensitive layer located on the bottom electrode and a transparent electrode located on the photosensitive layer. Then, a first electrical potential is supplied to the transparent electrode, a second electrical potential is supplied to the other of the drain/source pair, and a third electrical potential is supplied to the gate to turn on the read-out transistor, where the first electrical potential is less than the second electrical potential.

It is to be understood that both the foregoing general description and the following detailed description are by examples, and are intended to provide further explanation of the invention as claimed.

BRIEF DESCRIPTION OF THE DRAWINGS

For a more complete understanding of the present invention, and the advantages thereof, reference is now made to the following descriptions taken in conjunction with the accompanying drawing, in which.

DESCRIPTION OF THE PREFERRED EMBODIMENTS

Figure 1:
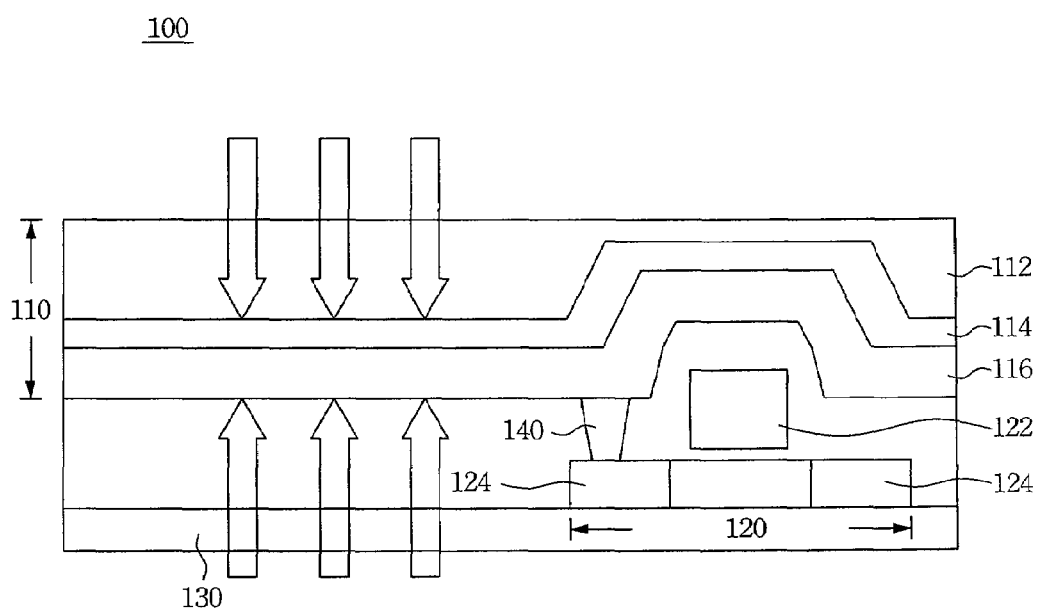
FIG. 1 is a cross-sectional view of a photosensitive device in accordance with the illustrative embodiments of the present disclosure.

Reference will now be made in detail to the present preferred embodiments of the invention, examples of which are illustrated in the accompanying drawings. Wherever possible, the same reference numbers are used in the drawings and the description to refer to the same or like parts.

An embedded light sensor device is forecasted to be more popular and default in current electronic system. More particular, flat panel makers (especially for Liquid Crystal Display) are currently quite interested in manufacturing embedded photo detection device with flat panel process. And they also require the embedded photo detection device is a cost effective solution. And this device cannot have complicated, many additional process steps under the same photo-to-electrical signal conversion performance.

According to one or more aspects of the present disclosure, a simple and innovative photosensitive device structure is introduced. Particularly, a new operating method for this photosensitive device are highlighted and addressed, in order to achieve the optimum photo conversion performance.

A method for operating a photosensitive device according to one or more aspects of the present disclosure is provided. The method may not only be executed to operate the photosensitive device, but also may be applicable or readily adaptable to all technology nodes. In an embodiment, the method comprises a first step toward providing the photosensitive device 100. Please refer to FIG. 1. FIG. 1 is a cross-sectional view of the photosensitive device 100 in accordance with the illustrative embodiments of the present disclosure. Furthermore, the photosensitive device 100 comprises a photo sensor 110, a photo sensor circuit 120 and a substrate 130, where the photo sensor 110 is located above the photo sensor circuit 120, and through a plug 140 electrically coupled with the photo sensor circuit 120, and the photo sensor circuit 120 is located on the substrate 130. The photo sensor 110 comprises a bottom electrode 116, a photosensitive layer 114 and a transparent electrode 112, where the photosensitive layer 114 is located on the bottom electrode 116, and the transparent electrode 112 is located on the photosensitive layer 114. In addition, the photo sensor circuit 120 may include a read-out transistor 120 comprising a gate 122 and a drain/source pair 124, in which one of the drain/source pair 124 is electrically coupled with the bottom electrode 116 through the plug 140.

It should be noted that the bottom electrode 116 is a different process layer from a gate layer 122. The bottom electrode 116 is an opaque electrode, which may be established from a metal-2 layer or a metal-1 layer. The gate electrode 122 can be formed from a metal layer (especially metal-1 layer) or a polysilicon layer. And the transparent top electrode can be formed by indium tin oxide (ITO) or zinc oxide. The thickness of zinc oxide electrode is about 20~800 nm, so that sufficient transparency can be obtained for light penetration It is worthy to address the bottom electrode 116 can serve the shielding plate for the backlight from the LCD panel module. Even under the high backlight (UP arrow in FIG. 1) illumination, no unfavorable backlight disturbance will be transferred to the photosensitive device 100 and no serious ambient light (DOWN arrow in FIG. 1) detection problem will be highlighted. In this way, a highly accurate photo detection can be achieved with this innovative photo sensitive device.

Moreover, the photosensitive layer 114 may be a compound layer (especially Si based compound material), and a plurality of nano-crystal structures are distributed in the compound layer. Additionally or alternatively, the photosensitive layer 114 is chosen from a group consisting essentially of Si-rich oxide, SiGe, GaAs, etc.

A nanocrystal structure can only be effective when the size of the nanocrystal is under the Bohr radius (~5 nm for Si), so that the quantum confinement effect can dominate over the original material characteristics. In this invention, the nanocrystal structure is designed for the first time to operate as the light absorption layer in a photo detector.

To manufacture nanocrystal structures, a silicon based nanocrytal process is taken as an example. The silicon nanocrystal layer is formed by a plasma enhance chemical vapor deposition (PECVD) process followed by a post laser annealing process. During the PECVD process, the ratio of $SiH_4$ and $N_2O$ is adjusted to obtain a desirable range of refractive index, which indicates the level of Si richness in the film. By proper post laser annealing (e.g 40~300 $mJ/cm^2$ annealing energy), the excess of silicon atoms are segregated, clustered, and turned into nano-crystal silicon. The refractive index of the silicon nano-crystal layer is from 1.6 to 2.4. The thickness of the silicon nano-crystal layer is from 100 nm to 500 nm. The size distribution for these nanocrytal structures are ranging from 1 nm to 10 nm.

More particularly, the photosensitive layer 114 may comprise the Cadmium Sulfide (CdS) compound layer. The Cadmium Sulfide is a direct bandgap semiconductor with a bandgap of 2.42 eV. It has useful properties for optoelectronics, being used in both photosensitive and photovoltaic devices. The CdS can be used as a photoresistor whose changes with incident light levels.

Figure 2A:
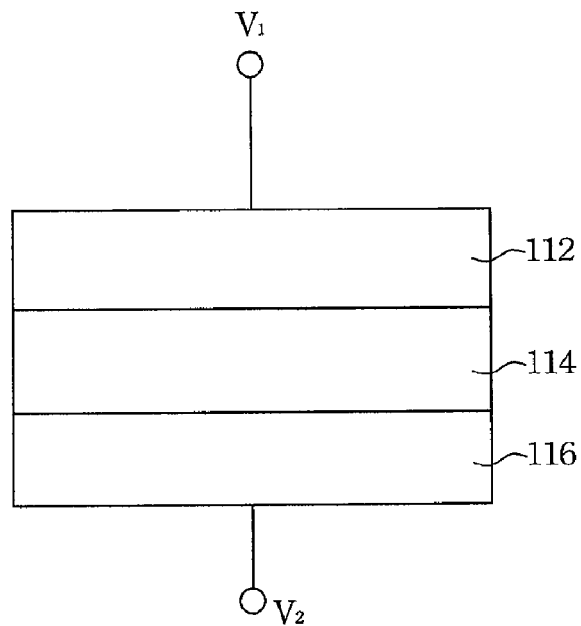
FIGS. 2A and 2B are each schematic views depicting one or more aspects of the present disclosure.
Figure 2B:
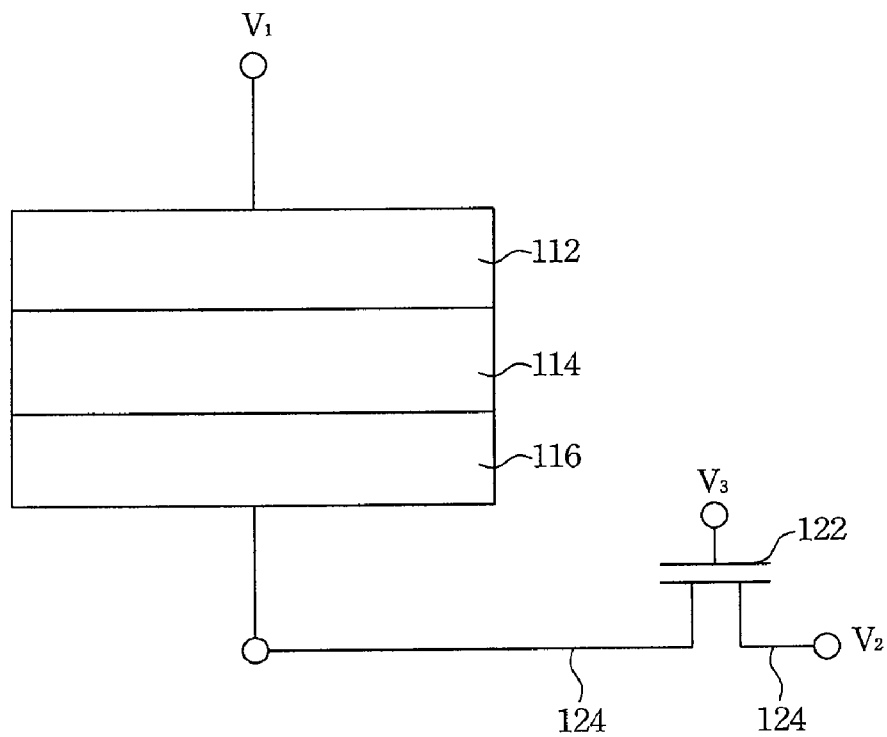

After the photosensitive device 100 is provided, during another step of the above-mentioned method for operating the photosensitive device 100, one or more parts of the photosensitive device 100 are supplied with electrical potentials, respectively. For a more complete understanding of the present disclosure, and the advantages thereof, please refer to FIG. 2A and FIG. 2B. FIG. 2A and FIG. 2B are each schematic views depicting one or more aspects of the present disclosure. In FIG. 2A, a first electrical potential $V_1$ is supplied to the transparent electrode 112, and a second electrical potential $V_2$ is supplied to the bottom electrode 116, where the first electrical potential $V_1$ must be less than the second electrical potential $V_2$, such that an electrical field generated by a electrical potential difference between the transparent electrode 112 and the bottom electrode 116. Thus, when light radiation passes through the transparent electrode 112, the photosensitive layer 114 captures photon of the light radiation and converts the photon into photocurrent, where the photocurrent may flow into the photo sensor circuit 120, in which the photocurrent is analyzed to determine the intensity of the light radiation. Furthermore, the bottom electrode 116 including an opaque material, such as metal or polysilicon, may act as a shield that is capable of reflecting the light radiation back to the photosensitive layer 114.

Moreover, In FIG. 2B, one of the drain/source pair 124 of the read-out transistor 120 is electrically coupled with the bottom electrode 116 of the photo sensor 110, in addition, a first electrical potential $V_1$ is supplied to the transparent electrode 112, and a second electrical potential $V_2$ is supplied to the other of the drain/source pair 124, where the first electrical potential $V_1$ must be less than the second electrical potential $V_2$. Furthermore, a third electrical potential $V_3$ is supplied to the gate 122, where the third electrical potential $V_3$ must be a adequate electrical potential for the gate 122 to turn on the read-out transistor 120. Thus, an electrical field generated by an electrical potential difference between the transparent electrode 112 and the bottom electrode 116. When light radiation passes through the transparent electrode 112, the photosensitive layer 114 captures photon of the light radiation and converts the photon into photocurrent, where the photocurrent may flow into the read-out transistor 120, in which the photocurrent is read and analyzed to determine the intensity of the light radiation. Furthermore, the bottom electrode 116 including an opaque material, such as metal or polysilicon, may act as a shield that is capable of reflecting the light radiation back to the photosensitive layer 114.

In a practical measurement system, however, a so-called dark current would exist as a noise to disturb the photo current which is relative to the optical excitation and emission mechanism. A dark current comes from the deep-level thermal generation/recombination process when a photosensitive device operates a certain bias. This dark current, actually, is not so relative to the ambient light intensity. It means that the dark current still contributes to the output current of this photosensitive device, no matter that the photosensitive device receives a lot of ambient light or not. Then the dark current is actual a disturbance for this ambient light sensor, especially for the dim light.

Figure 3:
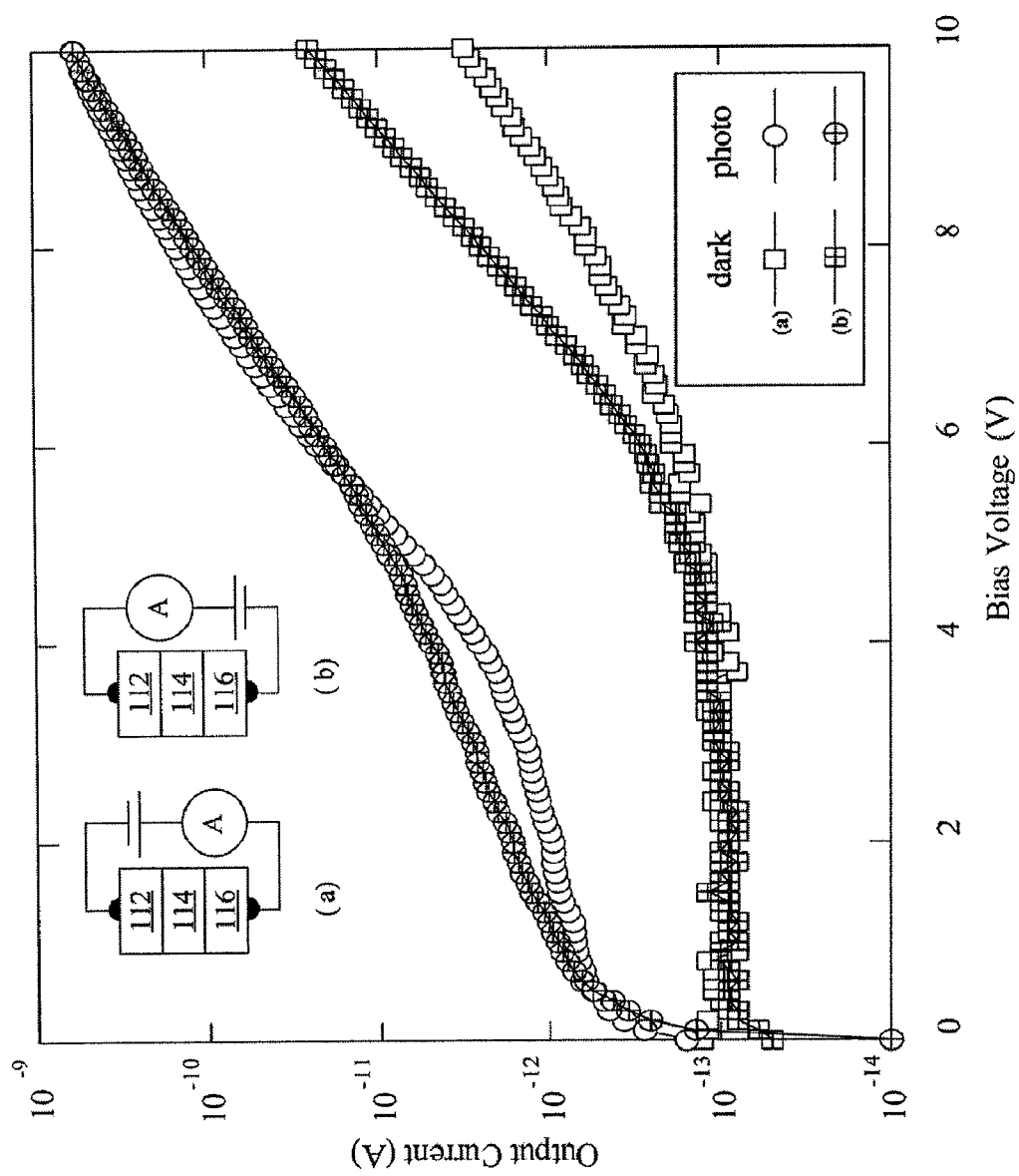
FIG. 3 is a graph depicting one or more aspects of the present disclosure.

For improving the photosensitive performance, we need to get the best noise-to-signal ratio. It means that an unwished dark current level needs to be minimized but photo-conversion current needs to be maximized. Please refer to FIG. 3. FIG. 3 is a graph depicting one or more aspects of the present disclosure, in which a measured I-V curve under different bias conditions applied to the bottom electrode 116 and transparent electrode 112 of a photosensitive device as shown in schematic views (a), (b). In FIG. 3, a positive potential coupled to the bottom electrode 116 and a grounded transparent electrode 112, as shown in the schematic views (a), can greatly reduce the dark current and enlarge the photo-conversion current. This bias setting is better than that with a grounded bottom electrode 116 but a positive biasing to the transparent electrode 112 as shown in the schematic views (b). In the preferred embodiment, the bias voltage is about 6V to about 9V. Through this proper bias configuration, the noise-to-signal ratio can be optimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for operating a photosensitive device, which comprising:
    providing the photosensitive device comprising a photo sensor circuit and a photo sensor, wherein the photo sensor is located above and electrically coupled with the photo sensor circuit, and wherein the photo sensor comprises a bottom electrode; a photosensitive layer located on the bottom electrode; and a transparent electrode located on the photosensitive layer;
    supplying a first electrical potential to the transparent electrode;
    supplying a second electrical potential to the bottom electrode, wherein the first electrical potential is less than the second electrical potential;
    capturing photon by means of the photosensitive layer; and
    converting the photon into photocurrent, wherein the photocurrent flows into the photo sensor circuit.

2. The method as claimed in claim 1, wherein the photosensitive layer is a compound layer with a plurality of nanocrystal particles distributed therein.

3. The method as claimed in claim 1, wherein the photosensitive layer is chosen from a group consisting essentially of Si-rich oxide, SiGe, GaAs, CdS and combinations thereof.

4. A method for operating a photosensitive device, which comprising:
    providing the photosensitive device comprising a substrate; a read-out transistor located on the substrate; and a photo sensor located above the read-out transistor, wherein the read-out transistor comprises at least a gate and a drain/source pair, and wherein the photo sensor comprises a bottom electrode electrically coupled with one of the drain/source pair; a photosensitive layer located on the bottom electrode; and a transparent electrode located on the photosensitive layer;
    supplying a first electrical potential to the transparent electrode;
    supplying a second electrical potential to the other of the drain/source pair, wherein the first electrical potential is less than the second electrical potential;
    supplying a third electrical potential to the gate to turn on the read-out transistor;
    capturing photon by means of the photosensitive layer; and
    converting the photon into photocurrent, wherein the photocurrent flows into the read-out transistor.

5. The method as claimed in claim 4, wherein the photosensitive layer is a compound layer with a plurality of nanocrystal particles distributed therein.

6. The method as claimed in claim 4, wherein the photosensitive layer is chosen from a group consisting essentially of Si-rich oxide, SiGe, GaAs, CdS and combinations thereof.

* * * * *

UNITED STATES PATENT AND TRADEMARK OFFICE
CERTIFICATE OF CORRECTION

PATENT NO.         : 7,575,948 B1                              Page 1 of 1
APPLICATION NO.    : 12/122132
DATED              : August 18, 2009
INVENTOR(S)        : Chrong-Jung Lin et al.

It is certified that error appears in the above-identified patent and that said Letters Patent is hereby corrected as shown below:

Title Page, Item (57)
In the Abstract of the Disclosure please change the last line (line 11) to delete the word "greater" and add the word less as follows:

...potential is ~~greater~~ less than the second electrical potential.

So that the revised abstract reads as follows:

...potential is less than the second electrical potential.

Signed and Sealed this

Twenty-seventh Day of April, 2010

David J. Kappos
*Director of the United States Patent and Trademark Office*